(12) United States Patent
Yasui

(10) Patent No.: US 10,714,312 B2
(45) Date of Patent: Jul. 14, 2020

(54) DATA PROCESSING METHOD, CHARGED PARTICLE BEAM WRITING APPARATUS, AND CHARGED PARTICLE BEAM WRITING SYSTEM

(71) Applicant: NuFlare Technology, Inc., Yokohama-shi (JP)

(72) Inventor: Kenichi Yasui, Kawasaki (JP)

(73) Assignee: NuFlare Technology, Inc., Yokohama-shi (JP)

(*) Notice: Subject to any disclaimer, the term of this patent is extended or adjusted under 35 U.S.C. 154(b) by 101 days.

(21) Appl. No.: 16/000,946

(22) Filed: Jun. 6, 2018

(65) Prior Publication Data

US 2018/0366297 A1 Dec. 20, 2018

(30) Foreign Application Priority Data

Jun. 14, 2017 (JP) .................................. 2017-116910

(51) Int. Cl.
*G06F 17/50* (2006.01)
*H01J 37/317* (2006.01)
(Continued)

(52) U.S. Cl.
CPC ...... *H01J 37/3177* (2013.01); *H01J 37/3007* (2013.01); *H01J 37/3026* (2013.01);
(Continued)

(58) Field of Classification Search
USPC ........ 320/50, 51, 52, 43, 54, 55; 716/50, 51, 716/52, 43, 54, 55
See application file for complete search history.

(56) References Cited

U.S. PATENT DOCUMENTS 7,592,611 B2* 9/2009 Kasahara .............. B82Y 10/00
250/492.1

7,619,230 B2* 11/2009 Suzuki .................. B82Y 10/00
250/492.2
(Continued)

FOREIGN PATENT DOCUMENTS

JP 11-329961 11/1999
JP 2009-81340 4/2009
(Continued)

OTHER PUBLICATIONS

Combined Taiwanese Office Action and Search Report dated Feb. 19, 2019 in Patent Application No. 107116701 (with partial English translation and English translation of categories of cited documents), 13 pages.
(Continued)

*Primary Examiner* — Brian Ngo
(74) *Attorney, Agent, or Firm* — Oblon, McClelland, Maier & Neustadt, L.L.P.

(57) ABSTRACT

In one embodiment, a data processing method is provided for generating writing data from design data and registering the writing data in a charged particle beam writing apparatus. The method includes generating the writing data by performing a plurality of conversion processes on a plurality of pieces of first frame data obtained through division of the design data corresponding to one chip, and performing a plurality of preprocessing processes on a plurality of pieces of second frame data obtained through division of the writing data of the chip, and registering the writing data of the chip in the charged particle beam writing apparatus. The plurality of conversion processes are performed in frame-basis pipeline processing, and the plurality of preprocessing processes are performed in frame-basis pipeline processing. The writing data is registered in the charged particle beam writing apparatus on a frame basis.

11 Claims, 4 Drawing Sheets

(51) Int. Cl.
*H01J 37/30* (2006.01)
*H01J 37/302* (2006.01)

(52) U.S. Cl.
CPC ... *H01J 37/3175* (2013.01); *H01J 2237/0492* (2013.01); *H01J 2237/31762* (2013.01); *H01J 2237/31776* (2013.01)

(56) References Cited

U.S. PATENT DOCUMENTS

| | | | | |
|---|---|---|---|---|
| 7,657,863 | B2* | 2/2010 | Iijima | B82Y 10/00 250/492.2 |
| 8,122,390 | B2* | 2/2012 | Yashima | B82Y 10/00 716/50 |
| 8,669,537 | B2* | 3/2014 | Yashima | B82Y 10/00 250/396 R |
| 8,878,149 | B2* | 11/2014 | Yashima | B82Y 10/00 250/492.1 |
| 2007/0226675 | A1* | 9/2007 | Anpo | H01J 37/3026 716/55 |
| 2008/0185538 | A1* | 8/2008 | Ohnishi | B82Y 10/00 250/492.22 |
| 2009/0216450 | A1* | 8/2009 | Sakamoto | B82Y 10/00 702/1 |
| 2012/0237877 | A1* | 9/2012 | Wang | H01J 37/3026 430/296 |
| 2012/0286174 | A1* | 11/2012 | Gomi | H01J 37/3026 250/492.3 |
| 2014/0237196 | A1* | 8/2014 | Yashima | H01J 37/3174 711/153 |
| 2016/0110491 | A1* | 4/2016 | Yasui | G06F 17/5081 250/492.22 |
| 2016/0300687 | A1* | 10/2016 | Gomi | H01J 37/1472 |
| 2017/0169994 | A1* | 6/2017 | Yasui | H01J 37/3026 |

FOREIGN PATENT DOCUMENTS

| | | |
|---|---|---|
| JP | 2010-73854 A | 4/2010 |
| JP | 2010-74040 A | 4/2010 |
| JP | 2010-267907 A | 11/2010 |
| JP | 2015-188014 | 10/2015 |
| KR | 10-2016-0115747 A | 10/2016 |
| TW | 201643930 A | 12/2016 |

OTHER PUBLICATIONS

Office Action dated May 28, 2019 in Korean Patent Application No. 10-2018-0068285 (with unedited computer generated English translation), 9 pages.

Combined Taiwanese Office Action and Search Report dated Aug. 8, 2019 in Patent Application No. 107116701 (with unedited computer generated English translation) 14 pages.

* cited by examiner

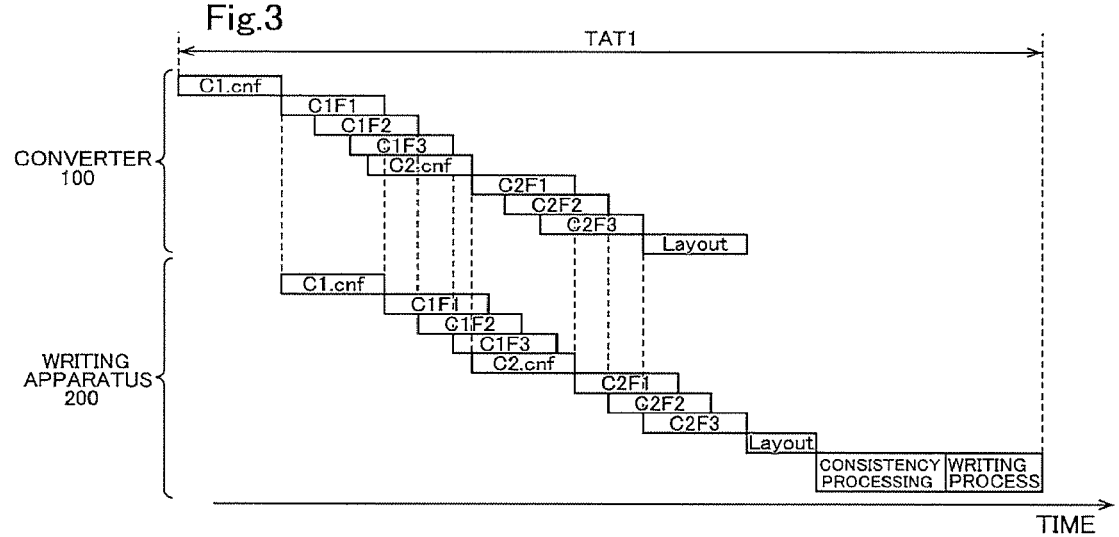
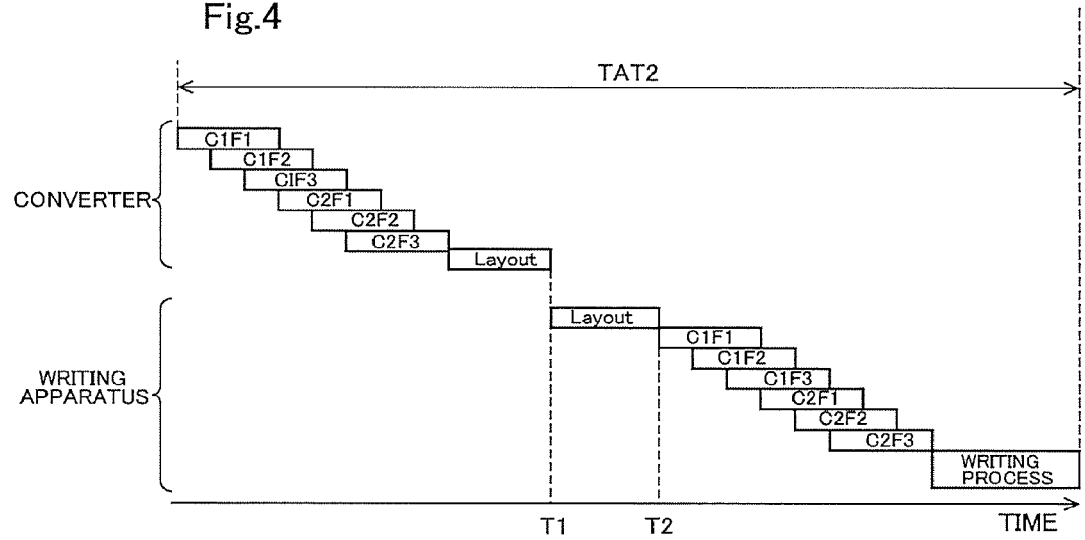

US 10,714,312 B2

DATA PROCESSING METHOD, CHARGED PARTICLE BEAM WRITING APPARATUS, AND CHARGED PARTICLE BEAM WRITING SYSTEM

CROSS REFERENCE TO RELATED APPLICATION

This application is based upon and claims benefit of priority from the Japanese Patent Application No. 2017-116910, filed on Jun. 14, 2017, the entire contents of which are incorporated herein by reference.

FIELD

The present invention relates to a data processing method, a charged particle beam writing apparatus, and a charged particle beam writing system.

BACKGROUND

The increasing integration of LSIs has led to finer and finer circuit line widths of semiconductor devices. An approach employed to form desired circuit patterns on semiconductor devices uses a step-and-repeat exposure system to reduce and transfer, onto a wafer, a high-precision master pattern (also called a mask, or a reticle particularly when used in a stepper or scanner) formed on a piece of quartz. The high-precision original pattern is written with an electron beam writing apparatus by use of a so-called electron beam lithography technique.

Processing, such as figure dividing and format conversion, suitable for an electron beam writing apparatus is performed on design data (CAD data) outside the writing apparatus (in an external apparatus), and writing data based on the format for the writing apparatus is generated. The writing data is transferred/input to the writing apparatus, and is subjected to a data registration process including multiple stages of processing, such as format check and calculation of the shot density.

The design data and the writing data include multiple pieces of chip data and layout data. The pieces of chip data include information such as the chip configurations. The layout data includes information such as the positions at which the chips are disposed. The chip data is divided into multiple frames. The frames are subjected, in frame-basis pipeline processing, to a data conversion process in the external apparatus and a data registration process in the writing apparatus, achieving improvement in the processing speed.

In the related art, writing data is registered (input) in a writing apparatus on a layout basis. After an external apparatus completes processing on all of the chip data and the layout data, the writing apparatus starts a data registration process. Therefore, it is difficult to reduce the TAT (Turn Around Time) of the writing process.

BRIEF DESCRIPTION OF THE DRAWINGS

FIG. 3 is a diagram illustrating an exemplary data process according to the present embodiment.

FIG. 4 is a diagram illustrating an exemplary data process according to a comparison example.

DETAILED DESCRIPTION

In one embodiment, a data processing method is provided for generating writing data from design data and registering the writing data in a charged particle beam writing apparatus. The method includes generating the writing data by performing a plurality of conversion processes on a plurality of pieces of first frame data obtained through division of the design data corresponding to one chip, and performing a plurality of preprocessing processes on a plurality of pieces of second frame data obtained through division of the writing data of the chip, and registering the writing data of the chip in the charged particle beam writing apparatus. The plurality of conversion processes are performed in frame-basis pipeline processing, and the plurality of preprocessing processes are performed in frame-basis pipeline processing. The writing data is registered in the charged particle beam writing apparatus on a frame basis.

An embodiment of the present invention will be described below with reference to the drawings.

Figure 1:
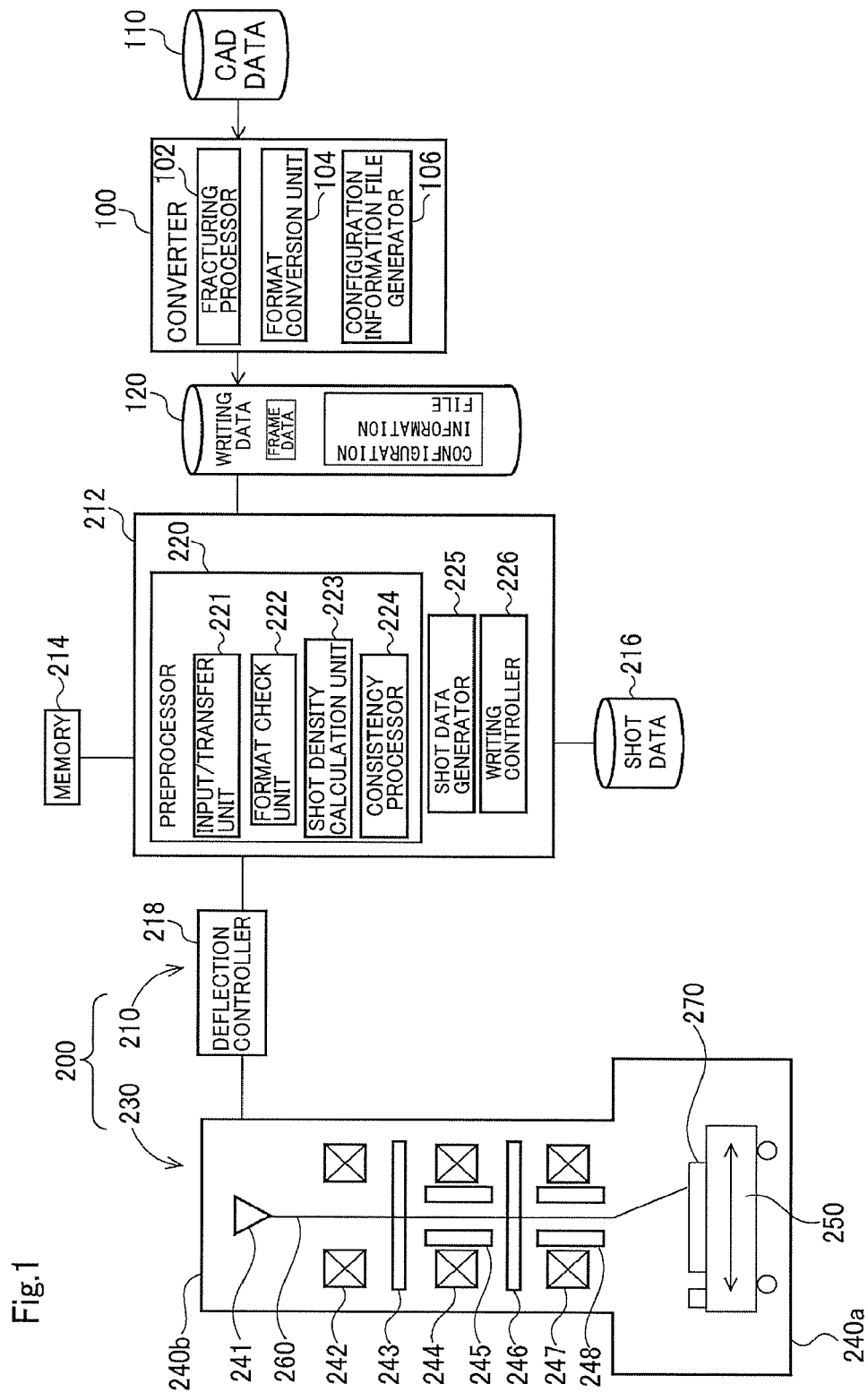
FIG. 1 is a diagram illustrating the configuration of a writing system according to an embodiment of the present invention.

FIG. 1 is a conceptual diagram illustrating the configuration of a writing system according to an embodiment. The writing system includes a converter 100 and a writing apparatus 200.

The writing apparatus 200 includes a controller 210 and a writing unit 230. The writing apparatus 200 is an exemplary charged particle beam writing apparatus. In particular, the writing apparatus 200 is an exemplary variable-shaping type writing apparatus. The writing unit 230 includes a writing chamber (writing room) 240a, an electron optical column 240b, an XY stage 250, an electron gun 241, an illumination lens 242, a first shaping aperture 243, a projection lens 244, a deflector 245, a second shaping aperture 246, an objective lens 247, and a deflector 248. A mask substrate 270 that is a writing target in a writing process is disposed on the XY stage 250.

In the writing unit 230, the mask substrate 270 which is a writing target is housed in the writing chamber 240a which communicates with the optical column 240b. The writing chamber 240a functions as a vacuum chamber having airtightness. The optical column 240b is provided on the top surface of the writing chamber 240a. The optical column 240b is used to form and deflect an electron beam by using an optical system and to irradiate the mask substrate 270 in the writing chamber 240a. At that time, the interior of both the writing chamber 240a and the optical column 240b is decompressed to a vacuum.

The stage 250 which supports the mask substrate 270 is provided in the writing chamber 240a. The stage 250 is formed so as to be movable in the X-axis direction and the Y-axis direction (hereinafter simply referred to as the X direction and the Y direction) orthogonal to each other in a horizontal plane. In the optical column 240b, the emitting unit 241 such as an electron gun that emits an electron beam 260, the illumination lens 242 that concentrates the electron beam 260, the first shaping aperture 243 for beam forming, the projection lens 244 for projection, the shaping deflector 245 for beam forming, the second shaping aperture 246 for beam forming, the objective lens 247 that causes the beam to focus on the mask substrate 270, and the deflector 248 for controlling the beam shot position on the mask substrate 270 are disposed.

In the writing unit 230, the emitting unit 241 emits the electron beam 260, and the first shaping aperture 243 is irradiated with the electron beam 260 by using the illumination lens 242. The first shaping aperture 243 has, for example, a rectangular opening. Thus, when the electron beam 260 has passed through the first shaping aperture 243, the electron beam is formed so as to have a rectangular cross section. The electron beam is projected onto the second shaping aperture 246 by using the projection lens 244. The projection position may be changed through deflection using the shaping deflector 245. The adjustment of the projection position enables control of the shape and size of the electron beam 260. After that, the electron beam 260 having passed through the second shaping aperture 246 is focused, for irradiation, on the mask substrate 270 on the stage 250 by using the objective lens 247. At that time, the shot position of the electron beam 260 on the mask substrate 270 on the stage 250 may be adjusted by using the deflector 248.

The controller 210 includes a control computer 212, a memory 214, a storage 216 such as a magnetic disk device, and a deflection controller 218. The control computer 212 includes a preprocessor 220, a shot data generator 225, and a writing controller 226. The preprocessor 220 includes an input/transfer unit 221, a format check unit 222, a shot density calculation unit 223, and a consistency processor 224.

The functions, such as those of the preprocessor 220, the shot data generator 225, and the writing controller 226, may be formed through hardware such as electric circuits, or may be configured through software such as programs for performing these functions. Data that is input/output to/from the preprocessor 220, the shot data generator 225, and the writing controller 226 and data that is being used in computation are stored in the memory 214 when necessary. The storage 216 stores shot data generated by the shot data generator 225.

The shot data generator 225 divides a writing pattern, which is defined in writing data registered by using a method described below, into multiple stripe-shaped (strip-shaped) stripe regions (for which the longitudinal direction is the X direction and the lateral direction is the Y direction). The shot data generator 225 further divides each stripe region into many subregions of rows and columns. In addition, the shot data generator 225 determines, for example, the shape, the size, and the position of a figure in each subregion. When the figure is not capable of being written in one shot, the shot data generator 225 divides the figure into multiple partial regions that may be written, and generates shot data. In the shot data, information, such as the figure type, the figure size, the irradiation position, and a dose (or the amount of dose modulation), is defined.

In writing a pattern, while causing the stage 250 to move in the longitudinal direction (X direction) of a stripe region, the writing controller 226 causes the electron beam 260 to be shot by using the deflector 248 at a given position so that a figure is written. After that, when writing in one stripe region is completed, the stage 250 is moved stepwise in the Y direction. Then, writing is performed on the next stripe region. These processes are repeatedly performed so that writing is performed with the electron beam 260 on the entire writing region of the mask substrate 270. The writing controller 226 outputs, to the deflection controller 218, a control signal based on the shot data, and controls deflection of the electron beam 260 using the shaping deflector 245 and the deflector 248.

The converter 100 which includes a fracturing processor 102, a format conversion unit 104, and a configuration information file generator 106 processes, for data conversion, design data (CAD data) stored in a storage 110, and generates writing data. The generated writing data is stored in a storage 120.

The design data includes layout data including information such as the positions at which chips are disposed, and also includes chip data about each of the multiple chips included in the layout. The design data is prepared, for example, by a designer of the semiconductor integrated circuit. The writing data is data having a format acceptable to the writing apparatus 200. For example, magnetic disk devices or semiconductor disk devices (flash memories) may be used as the storages 110 and 120.

The design data typically includes many fine patterns (such as figures), and the data volume is large. The writing data generated by performing data conversion on the design data has a larger data volume. Therefore, compression of the data volume is achieved by layering the data hierarchically.

Figure 2:
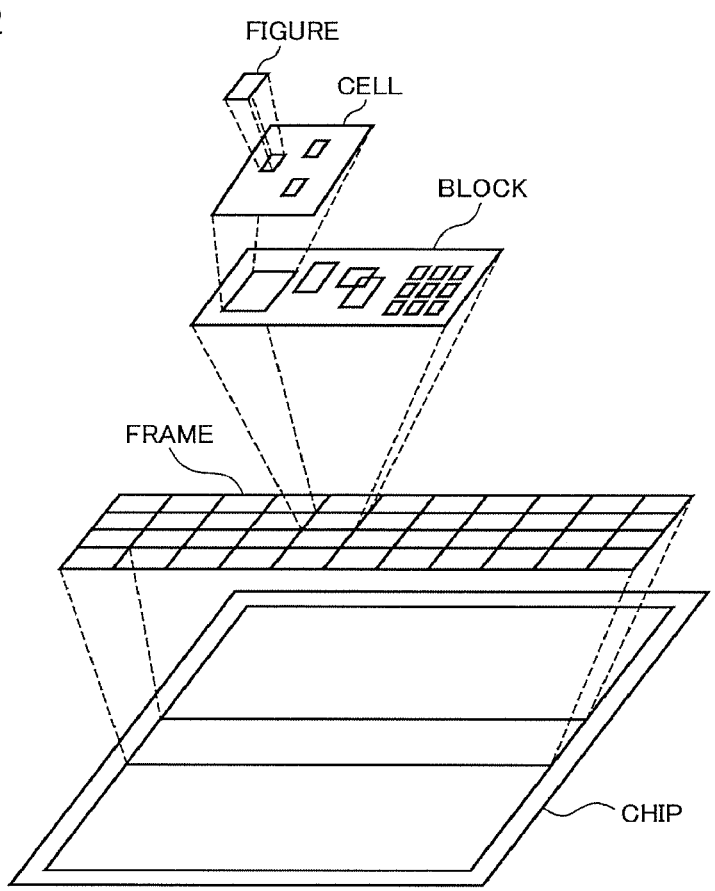
FIG. 2 is a diagram illustrating the hierarchical structure of data.

FIG. 2 is a diagram illustrating an exemplary hierarchical structure of data. In the design data, multiple cells are disposed on a chip. On each cell, figures serving as a pattern forming the cell are disposed. In the writing data, for example, as illustrated in FIG. 2, the writing region is hierarchically layered by using a series of internal configuration units that are the chip layer, the frame layer, the block layer, the cell layer, and the figure layer. The frame layer is obtained by dividing the chip region into multiple strip-shaped virtual regions in the y direction. The block layer is obtained by dividing the frame region into regions having a given size. The cell layer has cells included in a block. The figure layer has figures serving as a pattern forming a cell.

The design data includes variously shaped patterns such as polygonal figures. The fracturing processor 102 of the converter 100 divides these figures into multiple types of trapezoids acceptable to the writing apparatus 200. The format conversion unit 104 converts the design data into the format suitable for the writing apparatus 200.

Each piece of chip data in the design data is divided on a frame basis, and is constituted by frame-basis data files. The figure dividing process performed by the fracturing processor 102 and the format conversion process performed by the format conversion unit 104 are performed in frame-basis pipeline processing. The converter 100 generates writing data (a frame file) for each frame. Each frame has the same size.

The configuration information file generator 106 generates, for each chip, a chip configuration information file describing information, such as the chip size, the frame size (the size Lx in the x direction and the size Ly in the y direction), and the number n of divided frames.

The converter 100 generates a chip configuration information file, and stores the generated file in the storage 120. After generation of a chip configuration information file, the converter 100 performs frame-basis pipeline processing. After the processing, the converter 100 sequentially stores frame files in the storage 120.

The input/transfer unit 221 of the preprocessor 220 of the writing apparatus 200 monitors the storage 120, and inputs (transfers) a writing data file from the storage 120. Specifically, when a chip configuration information file is stored in the storage 120, the input/transfer unit 221 extracts the chip configuration information file. In addition, the input/transfer unit 221 extracts a frame file stored in the storage 120 as soon as possible. The format check unit 222 performs, as a format check, for example, a parity check on each frame.

The shot density calculation unit 223 calculates the shot density, which is the number of shots per unit area (or per unit time during writing), of each frame. The processes of the input/transfer unit 221, the format check unit 222, and the shot density calculation unit 223 are performed in frame-basis pipeline processing.

The consistency processor 224 performs processes performed only when all of the layout data and the chip configuration information files are available, and also performs a consistency process such as checksum verification. Examples of the processes performed only when all of the layout data and the chip configuration information files are available include a process of determining whether or not the mask accommodates all the chips. The layout data includes information about the positions at which the chips are disposed. In contrast, information about the chip size is included in a chip configuration information file. The consistency processor 224 determines whether or not the mask accommodates all the chips on the basis of the chip position arrangement information included in the layout data and the chip size information included in the chip configuration information files.

In the present embodiment, writing data (a frame file) is registered in the writing apparatus 200 on a frame basis. That is, when the converter 100 generates writing data of one frame, the writing data of one frame is registered in the writing apparatus 200.

FIG. 3 illustrates an exemplary data process performed by the converter 100 and the writing apparatus 200. In FIG. 3, assume that a mask includes two chips C1 and C2, and that the chip data of the chips C1 and C2 is virtually divided into three frames F1 to F3. For example, "C1F1" in FIG. 3 indicates a frame file corresponding to the frame F1 of the chip C1.

The converter 100 generates a chip configuration information file C1.cnf of the chip C1, and stores the generated file in the storage 120. After generation of the chip configuration information file C1.cnf, the converter 100 performs figure dividing and format conversion on the frames F1, F2, and F3 of the chip C1, in this sequence, in pipeline processing. Each frame file is sequentially stored in the storage 120 after the processing.

The preprocessor 220 of the writing apparatus 200 monitors the storage 120, and obtains the stored chip configuration information file C1.cnf as soon as possible. In addition, the preprocessor 220 monitors the storage 120, and performs data transfer, format check, and shot density calculation in such a manner that frame-basis pipeline processing is performed on the frames F1, F2, and F3 of the chip C1 in this sequence.

When the number of frame files having been transferred from the storage 120 is equal to the number n of frames which is included in the chip configuration information file C1.cnf, the preprocessor 220 determines that all of the frame files of the chip C1 have been received.

A parameter file describing parameters that are necessary in processing on writing data is prepared in advance and is registered in the writing apparatus 200. The parameter file includes, for example, the mesh size for area calculation and the maximum shot size for calculation of the number of shots.

When the processes of data transfer, format check, and shot density calculation on the chip data of the chip C1 end normally, the preprocessor 220 generates consistency information. The consistency information indicates checksum information of the files that are output in the pipeline processing performed by the preprocessor 220, and information described in the parameter file. The consistency information is used in the consistency process performed by the consistency processor 224.

Similar processes to the chip C1 are performed on the chip C2. After that, the layout data is transferred.

The preprocessor 220 performs the consistency process in response to registration of the layout data. After the consistency process, the writing unit 230 performs a writing process on the mask substrate 270.

Comparison Example

FIG. 4 illustrates an exemplary data process performed when writing data (chip data) is registered in a writing apparatus on a layout basis. Similarly to the example in FIG. 3, assume that a mask includes two chips C1 and C2, and that the chip data of the chips C1 and C2 is divided into three frames F1 to F3.

A converter performs figure dividing and format conversion on the frames F1, F2, and F3 of the chip C1 and the frames F1, F2, and F3 of the chip C2, in this sequence, in pipeline processing. When the frame F3 of the chip C2 has been processed, data processing is performed on the layout data.

When the converter has performed data processing on the layout data, a process of registering data in the writing apparatus is started (at time T1 in FIG. 4), and the layout data is registered in the writing apparatus. When the layout data has been registered (at time T2 in FIG. 4), the writing apparatus performs data transfer, format check, and shot density calculation on the frames F1, F2, and F3 of the chip C1 and the frames F1, F2, and F3 of the chip C2, in this sequence, in pipeline processing. After that, a writing process is performed on the mask substrate 270. In this comparison example, since the layout data is first registered in the writing apparatus, the consistency process as in the embodiment described above is not performed.

When writing data (chip data) is registered on a layout basis as in the data processing according to the comparison example, data registration in the writing apparatus is started after completion of processing on all data in the converter. This increases the TAT of the writing process (TAT2 in FIG. 4).

In contrast, in the embodiment described above, writing data is registered in the writing apparatus 200 on a frame basis. For example, as illustrated in FIG. 3, when the processing on the frame F1 of the chip C1 is completed and a frame file is generated, the frame file is registered in the writing apparatus 200 as soon as possible. This may make the TAT of the writing process (TAT1 in FIG. 3) shorter than the TAT (TAT2 in FIG. 4) of the comparison example. The more the number of frames is, the larger the effect in the reduction in TAT is.

For example, assume the following case: a layout includes five chips; each chip is divided into 200 frames; each frame processing time is 30 seconds; the layout processing time is 10 minutes; the actual writing time of the writing unit 230 is eight hours; and the consistency process takes 30 minutes. In this case, when writing data is registered on a frame basis as in the present embodiment, the TAT is about 16 hours. In contrast, when writing data is registered in a layout basis as in the comparison example, the TAT is about 25 hours. The technique according to the present embodiment may reduce the TAT by about 35% compared with the technique according to the comparison example.

In the embodiment described above, frame files are transferred after transfer of a chip configuration information file.

Alternatively, a chip configuration information file may be transferred after transfer of frame files.

As long as the storage 120 may be a storage area accessible from the converter 100 and the control computer 212, the storage 120 may be any storage area. The storage 120 may be a shared disk or a storage area connected over a network. The position (directory path) of the storage 120 is registered, in advance, in the converter 100 and the control computer 212.

In the embodiment described above, chip data is divided on a frame basis into frames having the same (fixed) size. When patterns are disposed in an imbalanced manner, frames having a large number of patterns and frames having a small number of patterns are present. Thus, the data size of one frame file may be different by a large amount from another, resulting in reduction in efficiency of the pipeline processing.

Therefore, the size of each file may be variable. In this case, in response to generation of a frame file, the converter 100 generates frame size information indicating the size of the frame (for example, the frame height). A chip configuration information file describes the chip size, and does not describe the frame size, the number of frames, and the like.

Figure 5:
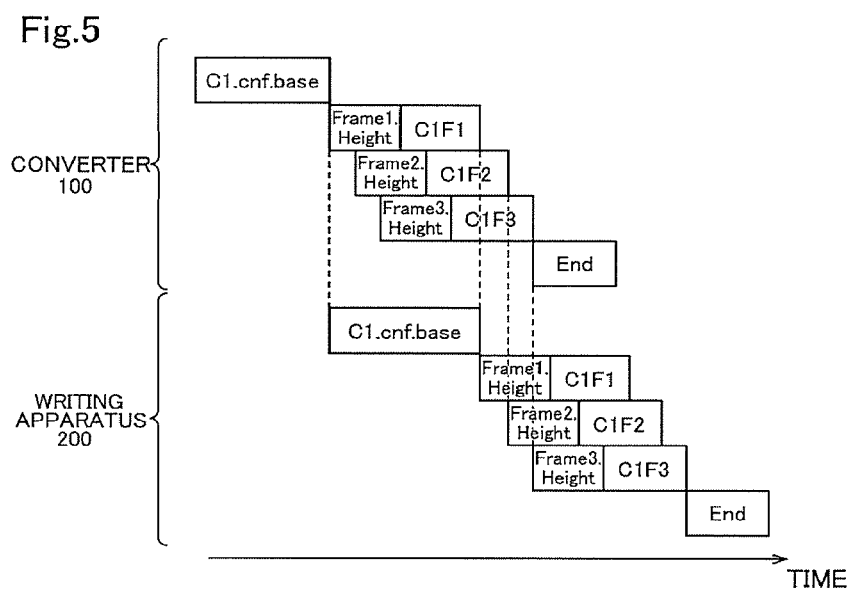
FIG. 5 is a diagram illustrating an exemplary data process according to a modified example.

FIG. 5 illustrates an exemplary data process performed by the converter 100 and the writing apparatus 200 in the case of the variable frame-size mode.

The converter 100 generates a chip configuration information file C1.cnf.base of the chip C1, and stores the generated file in the storage 120. The chip configuration information file C1.cnf.base describes information about the chip size and information indicating that the mode is the variable frame-size mode. After generation of the chip configuration information file C1.cnf.base, the converter 100 divides the chip C1 into the frames F1, F2, and F3 so that each frame file has a given data size. The converter 100 performs figure dividing and format conversion on the frames F1, F2, and F3, in this sequence, in pipeline processing. After the processing, the frame files are sequentially stored in the storage 120 along with frame height information (Frame.Height).

The preprocessor 220 of the writing apparatus 200 monitors the storage 120, and obtains the stored chip configuration information file C1.cnf.base as soon as possible. In addition, the preprocessor 220 monitors the storage 120. When the frame files and the frame height information are stored, the preprocessor 220 performs data transfer, format check, and shot density calculation on the frames F1, F2, and F3 of the chip C1, in this sequence, on a frame basis in pipeline processing.

The converter 100 generates and outputs all of the frame files of one chip, and then outputs an end detection file End. When the end detection file End is stored in the storage 120, the preprocessor 220 determines that all of the frame files of the chip C1 have been received.

The preprocessor 220 may sum the frame heights described in the frame height information having been transferred from the converter 100. When the total reaches the chip size described in the chip configuration information file C1.cnf.base, the preprocessor 220 may determine that all of the frame files of the chip C1 have been received. In this case, the converter 100 does not necessarily output an end detection file End.

Thus, even when the frame size is variable, writing data may be registered in the writing apparatus 200 on a frame basis, achieving a reduction in TAT.

In the embodiment described above, a timeout time may be set to the control computer 212, and the storage 120 may be monitored. When a time during which data is not registered from the converter 100 due to some error reaches the timeout time, the process may be aborted.

The writing apparatus according to the embodiment mentioned above may not be of a variable shaping type but may be a multi-beam writing apparatus. Although the embodiment mentioned above is directed to a case in which electron beams are used as an example of charged particle beams, the charged particle beams are not limited to electron beams but may be ion beams or other types of charged particle beams.

While certain embodiments have been described, these embodiments have been presented by way of example only, and are not intended to limit the scope of the inventions. Indeed, the novel methods and systems described herein may be embodied in a variety of other forms, furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A data processing method for generating writing data from design data and registering the writing data in a charged particle beam writing apparatus, the method comprising:

generating the writing data by performing a plurality of conversion processes on a plurality of pieces of first frame data obtained through division of the design data corresponding to one chip; and performing a plurality of preprocessing processes on a plurality of pieces of second frame data obtained through division of the writing data of the chip, and registering the writing data of the chip in the charged particle beam writing apparatus, wherein the plurality of conversion processes are performed in frame-basis pipeline processing, and the plurality of preprocessing processes are performed in frame-basis pipeline processing, wherein the writing data is registered in the charged particle beam writing apparatus on a frame basis, wherein consistency information including checksum information, mesh size for area calculation and maximum shot size for calculation of number of shots is generated in the preprocessing process, and wherein a consistency process including a process of determining whether or not a mask accommodates the chip and checksum verification is performed by use of the consistency information in the preprocessing process.

2. The data processing method according to claim 1, wherein the plurality of pieces of first frame data are generated by dividing the chip into a plurality of frames having an identical size, and wherein a chip configuration information file including a size of the chip, a frame size, and the number of divided frames is generated, and is registered in the charged particle beam writing apparatus.

3. The data processing method according to claim 2, further comprising:

registering layout data in the charged particle beam writing apparatus after registration of the writing data in the charged particle beam writing apparatus, the layout data including position arrangement information of the chip; and determining whether or not a mask accommodates the chip, on the basis of the chip size information and the position arrangement information of the chip, the chip size information being included in the chip configuration information file, the position arrangement information being included in the layout data.

4. The data processing method according to claim 2, wherein it is determined whether or not the number of pieces of second frame data that have been subjected to the preprocessing processes reaches the number of divided frames that is included in the chip configuration information file.

5. The data processing method according to claim 1, wherein the plurality of pieces of first frame data are generated by dividing the chip into a plurality of frames having different sizes, and
wherein size information of each of the frames is input to the charged particle beam writing apparatus.

6. A charged particle beam writing apparatus in which writing data is registered, the writing data being generated by an external apparatus performing a plurality of conversion processes on a plurality of pieces of first frame data in pipeline processing, the plurality of pieces of first frame data being obtained through division of design data corresponding to one chip, the charged particle beam writing apparatus comprising:
   a preprocessor performing a plurality of preprocessing processes on a plurality of pieces of second frame data in pipeline processing, the plurality of pieces of second frame data being obtained through division of the writing data of the chip, and registering the writing data of the chip;
   a shot data generator generating shot data on the basis of the writing data; and
   a writing unit writing a pattern on a substrate by using a charged particle beam on the basis of the shot data,
wherein the writing data is registered on a frame basis,
wherein the preprocessor generates consistency information including checksum information, mesh size for area calculation and maximum shot size for calculation of number of shots, and
wherein the preprocessor performs a consistency process including a process of determining whether or not a mask accommodates the chip and checksum verification by use of the consistency information.

7. The apparatus according to claim 6,
wherein the preprocessor
   registers a chip configuration information file before registration of the writing data, the chip configuration information file including a chip size, a frame size, and the number of divided frames,
   registers layout data after registration of the writing data, the layout data including position arrangement information of the chip, and
   determines whether or not a mask accommodates the chip, on the basis of the chip size information and the position arrangement information of the chip, the chip size information being included in the chip configuration information file, the position arrangement information being included in the layout data.

8. A charged particle beam writing system comprising:
   a converter that performs a plurality of conversion processes on a plurality of pieces of first frame data in pipeline processing, stores processed writing data in a storage, generates a chip configuration information file, and stores the chip configuration information file in the storage, the plurality of pieces of first frame data being obtained through division of design data corresponding to one chip, the chip configuration information file including a size of the chip; and
   a charged particle beam writing apparatus including a preprocessor, a shot data generator, and a writing unit, the preprocessor extracting the writing data of the chip and the chip configuration information file from the storage, the preprocessor performing a plurality of preprocessing processes on a plurality of pieces of second frame data in pipeline processing, the plurality of pieces of second frame data being obtained through division of the writing data, the preprocessor registering the writing data of the chip on a frame basis, the shot data generator generating shot data on the basis of the writing data, the writing unit writing a pattern on a substrate by using a charged particle beam on the basis of the shot data,
wherein the preprocessor generates consistency information including checksum information, mesh size for area calculation and maximum shot size for calculation of number of shots, and
wherein the preprocessor performs a consistency process including a process of determining whether or not a mask accommodates the chip and checksum verification by use of the consistency information.

9. The system according to claim 8,
wherein the converter
   generates the plurality of pieces of first frame data by dividing the chip into a plurality of frames having an identical size, and generates the chip configuration information file including a frame size and the number of divided frames, and
   stores the writing data in the storage, and then stores layout data in the storage, the layout data including position arrangement information of the chip.

10. The system according to claim 9,
wherein the preprocessor extracts the layout data from the storage, and determines whether or not a mask accommodates the chip on the basis of the chip size information and the position arrangement information of the chip, the chip size information being included in the chip configuration information file, the position arrangement information being included in the layout data.

11. The charged particle beam writing system according to claim 9,
wherein the preprocessor determines whether or not the number of pieces of second frame data having been subjected to the preprocessing processes reaches the number of divided frames that is included in the chip configuration information file.

* * * * *